(12) United States Patent
Manfrini et al.

(10) Patent No.: US 10,971,684 B2
(45) Date of Patent: Apr. 6, 2021

(54) INTERCALATED METAL/DIELECTRIC STRUCTURE FOR NONVOLATILE MEMORY DEVICES

(71) Applicant: Taiwan Semiconductor Manufacturing Co., Ltd., Hsin-Chu (TW)

(72) Inventors: Mauricio Manfrini, Leuven (BE); Chung-Te Lin, Tainan (TW); Gerben Doornbos, Kessel-Lo (BE); Marcus Johannes Henricus van Dal, Linden (BE)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/412,810

(22) Filed: May 15, 2019

(65) Prior Publication Data

US 2020/0136038 A1    Apr. 30, 2020

Related U.S. Application Data

(60) Provisional application No. 62/752,571, filed on Oct. 30, 2018.

(51) Int. Cl.
*H01L 47/00*  (2006.01)
*H01L 45/00*  (2006.01)
(Continued)

(52) U.S. Cl.
CPC ...... *H01L 45/1226* (2013.01); *G11C 13/0007* (2013.01); *G11C 13/0011* (2013.01);
(Continued)

(58) Field of Classification Search
CPC ............ H01L 45/1226; H01L 45/1253; H01L 27/2436; H01L 45/1608; H01L 45/145; G11C 13/0007; G11C 13/0011
(Continued)

(56) References Cited

U.S. PATENT DOCUMENTS 9,385,316 B2    7/2016  Liao et al.
9,419,057 B2 *  8/2016  Mieno .................. H01L 45/147
(Continued)

OTHER PUBLICATIONS

Thou et al. "Crossbar RRAM Arrays: Selector Device Requirements During Read Operation." IEEE Transactions on Electron Devices, vol. 61, No. 5, May 2014.
(Continued)

*Primary Examiner* — Vu A Vu
(74) *Attorney, Agent, or Firm* — Eschweiler & Potashnik, LLC

(57) ABSTRACT

Some embodiments relate to an integrated chip including a memory device. The memory device includes a bottom electrode disposed over a semiconductor substrate. An upper electrode is disposed over the bottom electrode. An intercalated metal/dielectric structure is sandwiched between the bottom electrode and the upper electrode. The intercalated metal/dielectric structure comprises a lower dielectric layer over the bottom electrode, an upper dielectric layer over the lower dielectric layer, and a first metal layer separating the upper dielectric layer from the lower dielectric layer.

20 Claims, 9 Drawing Sheets

(51) Int. Cl.
  *H01L 27/24* (2006.01)
  *G11C 13/00* (2006.01)
(52) U.S. Cl.
  CPC ...... *H01L 27/2436* (2013.01); *H01L 45/1253* (2013.01); *H01L 45/145* (2013.01); *H01L 45/1608* (2013.01)
(58) Field of Classification Search
  USPC .......................................................... 257/4
  See application file for complete search history.

(56) References Cited

U.S. PATENT DOCUMENTS

| | | | |
|---|---|---|---|
| 9,431,609 B2* | 8/2016 | Dang | H01L 45/147 |
| 10,121,540 B1 | 11/2018 | Jo | |
| 10,483,460 B2* | 11/2019 | Nagel | H01L 43/08 |
| 2010/0248431 A1 | 9/2010 | Nishitani et al. | |
| 2011/0310653 A1 | 12/2011 | Kreupl et al. | |
| 2015/0340406 A1* | 11/2015 | Jo | H01L 45/122 29/604 |
| 2016/0218283 A1 | 7/2016 | Trinh et al. | |

OTHER PUBLICATIONS

Conley, John. "Engineering the Performance of Metal/Insulator/Metal Devices with ALD Nanolaminate Insulators." 2015 IEEE International Integrated Reliability Workshop (IIRW), published Oct. 2015.

Alimardani et al. "Investigation of the impact of insulator material on the performance of dissimilar electrode metal-insulator-metal diodes." Journal of Applied Physics 116, 024508 (2014), published Jul. 2014.

Lee et al. "Memory window engineering of Ta2O5-x oxide-based resistive switches via incorporation of various insulating frames." Scientific Reports | 6:30333 | DOI: 10.1038/srep30333, published on Jul. 25, 2016.

Woo et al. "Multilayer-oxide-based bidirectional cell selector device for cross-point resistive memory applications." Applied Physics Letters 103, 202113 (2013), published on Nov. 11, 2013.

Park et al. "Improved threshold switching characteristics of multi-layer NbOx for 3-D selector application." Microelectronic Engineering 147 (2015) 318-320, published on Apr. 23, 2015.

Littau et al. "Challenges in Vertically Stackable Selectors for 3-D Cross-Point Non Volatile Memories." Intermolecular, Inc., published on Aug. 8, 2017.

* cited by examiner

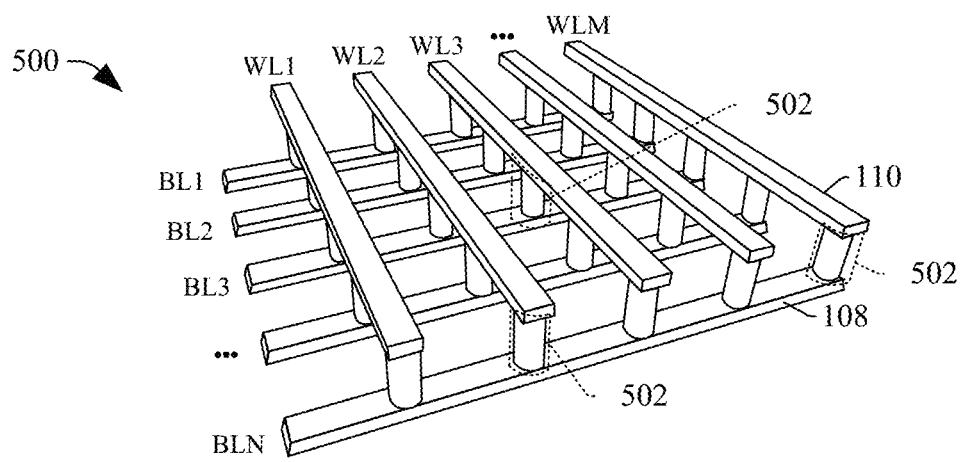
Fig. 5A
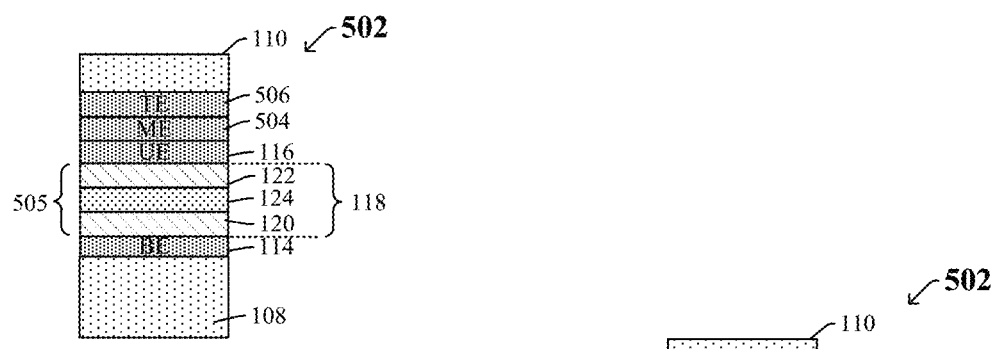
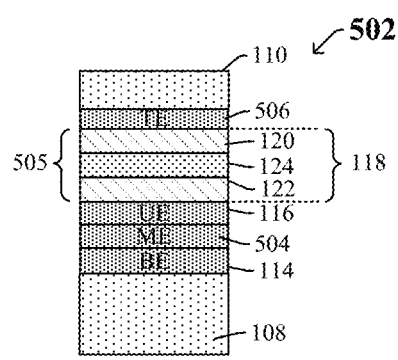
Fig. 5B
Fig. 5C
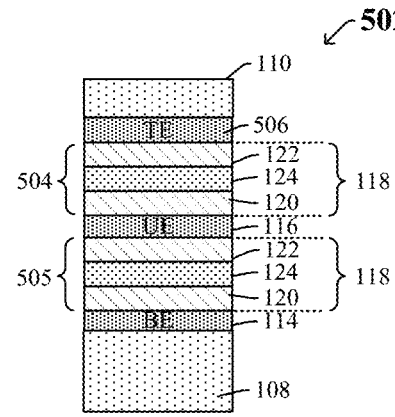
Fig. 5D

INTERCALATED METAL/DIELECTRIC STRUCTURE FOR NONVOLATILE MEMORY DEVICES

REFERENCE TO RELATED APPLICATION

This application claims the benefit of U.S. Provisional Application No. 62/752,571, filed on Oct. 30, 2018, the contents of which are hereby incorporated by reference in their entirety.

BACKGROUND

Many modern day electronic devices contain electronic memory configured to store data. Electronic memory may be volatile memory or non-volatile memory. Volatile memory stores data when it is powered, while non-volatile memory is able to store data when power is removed. There are many different types of non-volatile memory that fall within the present disclosure, including Programmable Metallization Cell (PMC) Random Access Memory (RAM) (also referred to in some contexts as Conductive Bridge RAM (CBRAM)), Phase Change RAM (PCRAM), oxide based RAM (OxRAM), Magnetic RAM (MRAM), Resistive RAM (RRAM), etc. RRAM in particular is one promising candidate for a next generation non-volatile memory technology. RRAM has a simple structure, consumes a small cell area, has a low switching voltage and fast switching times, and is compatible with CMOS fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A illustrates a perspective view of some additional embodiments of an integrated circuit in the form of a cross-bar RRAM architecture, which comprises a resistive random access memory (RRAM) device with an intercalated metal/dielectric structure as a selector and/or memory element.

FIGS. 5B-5D provide cross-sectional views of some embodiments of memory cells consistent with FIG. 5A.

DETAILED DESCRIPTION

Figure 1A:
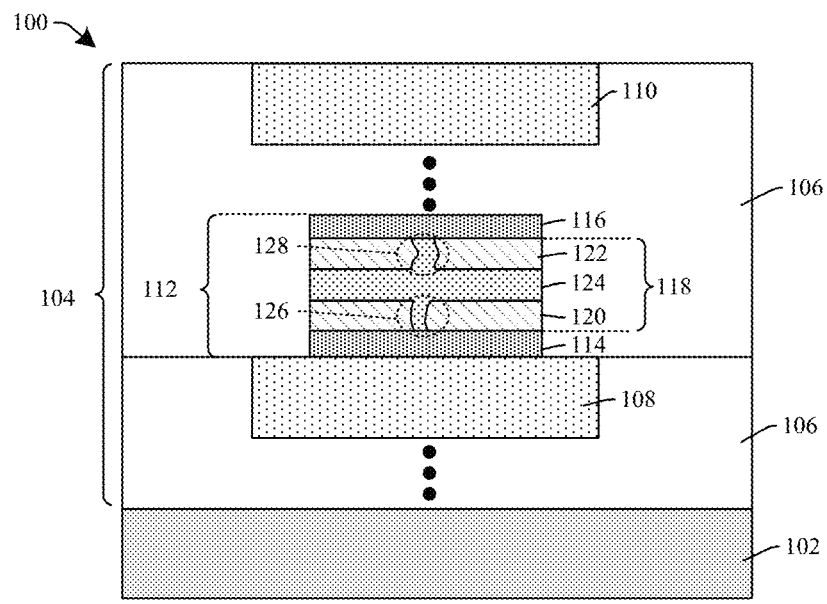
FIGS. 1A-1B illustrate a cross-sectional view of some embodiments of an integrated circuit comprising a resistive random access memory (RRAM) device with an intercalated metal/dielectric structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) devices generally comprise a data storage dielectric layer, such as a high-κ dielectric layer or silicon dioxide layer, arranged between upper and lower conductive electrodes disposed within a back-end-of-the-line (BEOL) metallization stack. RRAM devices are configured to operate based upon a process of reversible switching between resistive states. This reversible switching is enabled by selectively forming (or breaking) a conductive filament through data storage dielectric layer. For example, a first bias condition can be applied over the upper and lower conductive electrodes to selectively form a conductive filament extending through the data storage dielectric layer, thereby putting the RRAM device in a low-resistance state. When a second voltage is applied, the conductive filament is removed and/or broken, thereby electrically isolating the upper and lower electrodes and putting the RRAM device in a high-resistance state. Thus, RRAM device can be switched between a first (e.g., low) resistance state, a second (e.g., high) resistance state, depending on the bias condition applied to the RRAM device.

Some aspects of the present disclosure lie in the appreciation that the data storage dielectric layer in typical RRAM devices is somewhat "thick" to provide adequate isolation between the upper and lower electrodes. This thickness of the data storage dielectric layer causes the conductive filament to take a long time to form, which causes slow performance. In some embodiments, a single "thin" film of data storage dielectric can separate the upper and lower electrodes from one another. However such a single thin film may be susceptible to reliability issues, such as voltage breakdown, particularly over a large number of read and write operations. Therefore, in some embodiments of the present disclosure, an intercalated metal/dielectric structure, which is made up of a number of thin data storage dielectric layers that alternate with a number of metal layers, is sandwiched between the upper electrode and the lower electrode. Because each data storage dielectric layer is "thin", each is able to form a conductive filament there through in a relatively short period of time. Consequently, this intercalated metal/dielectric structure provides better reliability, and at the same time provides higher performance (e.g., faster write operations when forming conductive filaments) than other approaches. Further, it will be appreciated that although the present disclosure is set forth in the context of RRAM, that the intercalated metal/dielectric structure may also be utilized in other types of non-volatile memory, including Programmable Metallization Cell (PMC) Random Access Memory (RAM), Phase Change RAM (PCRAM), oxide based RAM (OxRAM), and Magnetic RAM (MRAM) for example.

Figure 1B:
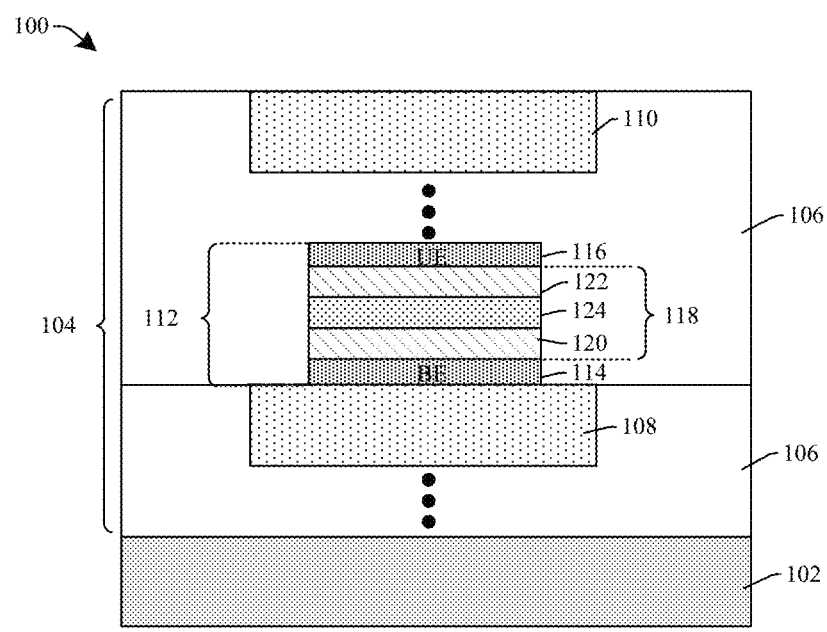

FIGS. 1A-1B illustrate a cross-sectional view of some embodiments of an integrated circuit 100 including resistive random access memory (RRAM) device having an intercalated metal/dielectric structure. The integrated circuit 100 includes a semiconductor substrate 102 with a back-end-of-line (BEOL) interconnect structure 104 disposed over the semiconductor substrate 102. The BEOL interconnect structure 104 includes a number of metal layers that are arranged within a data storage dielectric structure 106. For example, the illustrated metal layers include a lower metal line 108 and an upper metal line 110, with an RRAM device 112 arranged between the lower metal line 108 and the upper metal line 110. The RRAM device 112 includes a bottom electrode 114 which can be in direct contact with the lower metal line 108, and an upper electrode 116 which can be in direct contact with the upper metal line 110. Alternatively, a lower via and/or other structures (not shown) can couple the bottom electrode 114 to the lower metal line 108, and/or an upper via and/or other structures (not shown) can couple the upper electrode 116 to the upper metal line 110.

An intercalated metal/dielectric structure 118 is sandwiched between the bottom electrode 114 and the upper electrode 116. The intercalated metal/dielectric structure 118 is made up of a number of thin dielectric layers that are stacked in alternating fashion with a number of metal layers. For example, FIGS. 1A-1B's embodiment illustrates an intercalated metal/dielectric structure 118 comprising a lower dielectric layer 120 over the bottom electrode 114, an upper dielectric layer 122 over the lower dielectric layer, and a first metal layer 124 separating the upper dielectric layer 122 from the lower dielectric layer 120. Although FIGS. 1A-1B illustrate two dielectric layers (e.g., 120, 122) separated from one another by a single metal layer (e.g., 124), any number of metal layers with intervening dielectric layers can be disposed between the bottom electrode and the upper electrode.

In some embodiments, the upper dielectric layer 122 and/or lower dielectric layer 120 comprise a high-κ dielectric material, such as a hafnium-based oxide (e.g., $HfO_2$), a zirconium-based oxide (e.g., $ZrO_2$), and/or a titanium-based oxide (e.g., $TiO_2$). The high-κ dielectric material has a dielectric constant, κ, that is greater than that of silicon dioxide; and thus the high-κ dielectric material has a dielectric constant of greater than about 3.9. In other embodiments, the upper dielectric layer 122 and/or lower dielectric layer 120 comprise silicon dioxide. In some embodiments, the first metal layer 124 comprises a conductive metal, such as copper, aluminum, tungsten, and/or alloys of these metals including ternary chalcogenides. The upper electrode 116 and the bottom electrode 114 comprise a metal, such as tantalum, tantalum nitride, titanium, or titanium nitride, for example.

In some embodiments, the overall thickness of the intercalated metal/dielectric structure 118 is less than 50 nm. Further, a ratio of $t_{metal}:t_{dielectric}$ can be tuned during manufacturing; where $t_{metal}$ is the total thickness of the sum of all the metal layers between the uppermost surface of the bottom electrode and the bottommost surface of the upper electrode, and where $t_{dielectric}$ is the total thickness of the sum of all the dielectric layers between the uppermost surface of the bottom electrode and the bottommost surface of the upper electrode. In some embodiments, $t_{metal}:t_{dielectric}$ can range from approximately 1:10 to approximately 2:1.

In some embodiments, the dielectric layers of the intercalated dielectric/metal structure have different thicknesses from one another (though they can also be equal to one another); and the metal layers of the intercalated structure have different thicknesses from one another (though they can also be equal to one another). Further, the thicknesses of the dielectric layers are often different from the thicknesses of the metal layers. In some embodiments, the metal layers have individual thicknesses ranging from 1 nm to 50 nm, and the dielectric layers have individual thicknesses ranging from 0.5 nm to 5 nm. In some cases, each dielectric layer has a thickness that is less than or equal to 10 nm (or even less than or equal to 5 nm), as thicknesses greater than 10 nm may thwart or impair filament formation. In some cases, the metal layers can be made of copper alloys and have individual thicknesses that vary between 15 nm to 30 nm, which provides for good tradeoffs between manufacturing costs and quality. If higher quality and/or thinner metal layers are desired, atomic layer deposition (ALD) or other deposition techniques could be used.

Once manufacturing of the device is complete, a firing (or forming) voltage (Vff) can be applied to the cell to form the filament for the first time. After the filament is initially formed, then SET and RESET biases are used thereafter to write first and second data states to the cell (e.g., "1" and "0"). For example, the firing voltage can include a voltage of +10 V applied to the top electrode while a voltage of 0 V is applied to the bottom electrode for a time ranging from 10 ns to 1 μs, thereby causing the filament to initially form.

A first bias condition—a so-called SET bias—can be applied across the bottom electrode 114 and upper electrode 116 to put the RRAM device into a low-resistance state, wherein conductive filaments are formed to extend through the upper and lower dielectric layers as shown in FIG. 1A. Thus, in FIG. 1A, a lower conductive filament 126 extends from the bottom electrode 114 through the lower dielectric layer 120 and to the first metal layer 124, and an upper conductive filament 128 extends from the first metal layer 124 through the upper dielectric layer 122 and to the upper electrode 116. For example, in some embodiments, the first bias condition can be—for instance, top electrode (TE) at +10 V, bottom electrode (BE) at 0 V applied for a time of 10 ns.

When a second bias condition—a so-called RESET bias—is applied across the bottom electrode 114 and upper electrode 116, at least a portion of the lower conductive filament (126 in FIG. 1A) and/or upper conductive filament (e.g., 128 in FIG. 1A) is removed or broken, such that the lower dielectric layer 120 and/or upper dielectric layer 122 fully separate bottom electrode 114 and the upper electrode 116 from one another, thereby putting the RRAM device in a high-resistance state such as shown in FIG. 1B for example. Thus, in FIG. 1B, at least a portion of the lower conductive filament is removed or broken so the lower dielectric layer 120 fully separates the bottom electrode 114 from the first metal layer 124, and at least a portion of the upper conductive filament is removed or broken so the upper dielectric layer 122 fully separates the first metal layer 124 from the upper electrode 116. For example, in some embodiments, the second bias condition can be—for instance, TE at 0 V, BE at +5 V applied for a time of 20 ns. Thus, by switching between the first bias condition and second bias condition, the RRAM device can be repeatedly and reliably switched between the low-resistance state (FIG. 1A) and the high-resistance state (FIG. 1B), for example, to act as a selector in a cross-bar memory array or to store data in an RRAM cell.

Compared to embodiments with only a single dielectric layer between the bottom electrode 114 and upper electrode 116, having multiple dielectric layers (e.g., the lower dielectric layer 120 and upper dielectric layer 122) provides shorter conductive filaments which are formed more quickly and at reduced voltages, allowing for faster switching times from the high-resistance state to the low-resistance state. Shorter conducting paths can also improve reliability.

FIGS. 2A-2B through FIGS. 4A-4B show various non-limiting examples of additional ways in which the intercalated metal/dielectric structure 118 can be implemented. Compared to FIGS. 1A-1B, which illustrated a (single) first metal layer 124 disposed between a lower dielectric layer 120 and an upper dielectric layer 122, FIGS. 2A-2B through 4A-4B show additional metal layer(s) and/or dielectric layer(s).

Figure 2A:
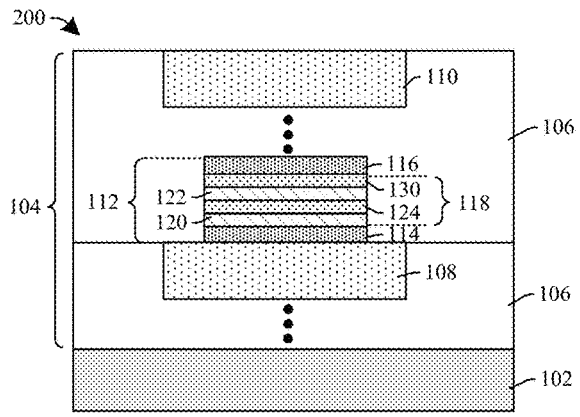
FIGS. 2A-2B illustrate a cross-sectional view of some embodiments of an integrated circuit comprising a resistive random access memory (RRAM) device with an intercalated metal/dielectric structure.
Figure 2B:
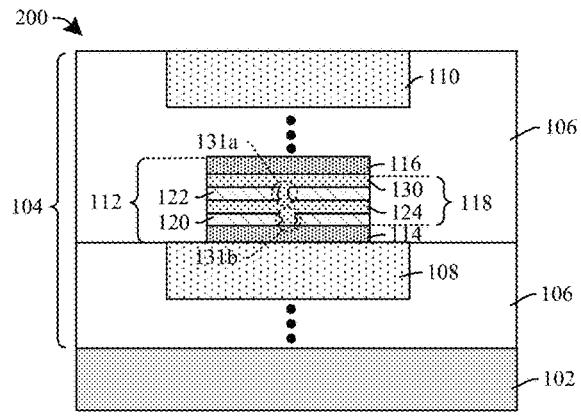

Turning now to FIGS. 2A-2B, one can see some embodiments of an RRAM device 200 wherein the intercalated metal/dielectric structure 118 includes an upper dielectric layer 122 and a lower dielectric layer 120. A first metal layer 124 is disposed between the upper dielectric layer 122 and the lower dielectric layer 120. A second metal layer 130 is disposed over the upper dielectric layer 122. The second metal layer 130 separates the upper dielectric layer 12 from the upper electrode 116. FIG. 2A illustrates the RRAM device 200 in a high resistance state, while FIG. 2B illustrates the RRAM device 200 in a low-resistance state where conductive filaments 131a, 131b are present.

Figure 3A:
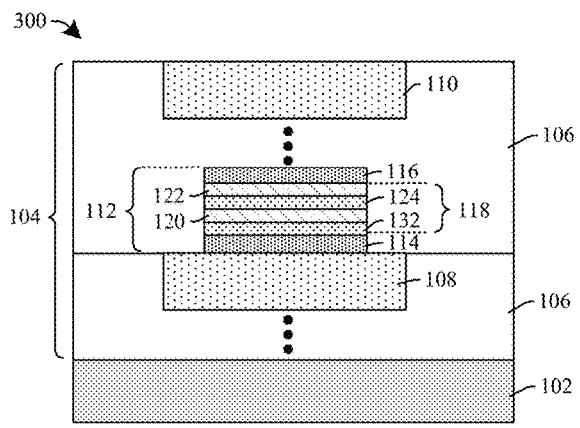
FIGS. 3A-3B illustrate a cross-sectional view of some embodiments of an integrated circuit comprising a resistive random access memory (RRAM) device with an intercalated metal/dielectric structure.
Figure 3B:
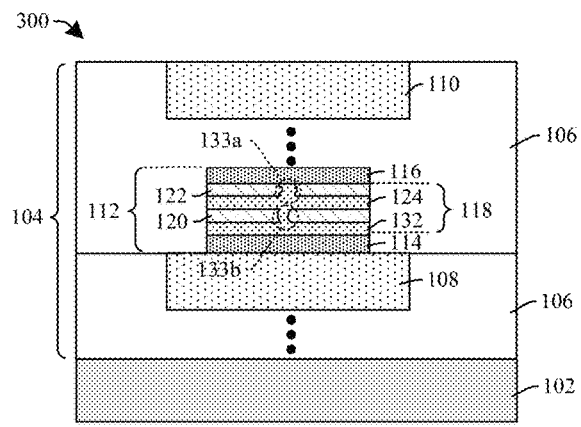

FIGS. 3A-3B show an alternate embodiment of an RRAM device 300 wherein the intercalated metal/dielectric structure 118 again includes an upper dielectric layer 122 and a lower dielectric layer 120. A first metal layer 124 is disposed between the upper dielectric layer 122 and the lower dielectric layer 120. A second metal layer 132 is disposed over the bottom electrode 114. The second metal layer 132 separates the bottom electrode 114 from the lower dielectric layer 120. FIG. 3A illustrates the RRAM device 300 in a high resistance state, while FIG. 3B illustrates the RRAM device 300 in a low-resistance state where conductive filaments 133a, 133b are present.

Figure 4A:
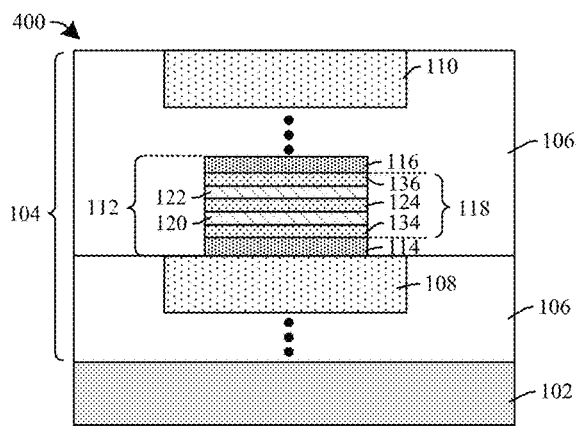
FIGS. 4A-4B illustrate a cross-sectional view of some embodiments of an integrated circuit comprising a resistive random access memory (RRAM) device with an intercalated metal/dielectric structure.
Figure 4B:
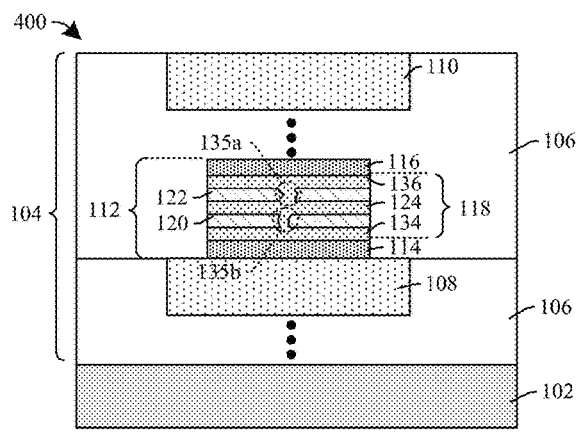

FIGS. 4A-4B show an alternate embodiment of an RRAM device 400 wherein the intercalated metal/dielectric structure 118 again includes an upper dielectric layer 122 and a lower dielectric layer 120. A first metal layer 124 is again disposed between the upper dielectric layer 122 and the lower dielectric layer 120. In this embodiment, a second metal layer 134 is disposed over the bottom electrode 114. The second metal layer 134 separates the bottom electrode 114 from the lower dielectric layer 120. A third metal layer 136 is disposed over the upper dielectric layer 122. The third metal layer 136 separates the upper dielectric layer 122 from the upper electrode 116. FIG. 4A illustrates the RRAM device 400 in a high resistance state, while FIG. 4B illustrates the RRAM device 400 in a low-resistance state where conductive filaments 135a, 135b are present.

Thus, as can be appreciated, the intercalated metal/dielectric structure 118 can take various forms depending on the implementation. Although FIGS. 1A-1B through 4A-4B show some examples with two dielectric layers (e.g., an upper dielectric layer 122 and a lower dielectric layer 120) and one, two, or three metal layers; in general, the intercalated metal/dielectric structure 118 can have any number of dielectric layers and any number of metal layers, which are stacked in alternating fashion with one another. Typically, the overall thickness of the intercalated metal/dielectric structure 118 is sufficiently thin that the RRAM device 112 can reside within a height corresponding to nearest neighboring metal lines. For example, in some embodiments, a height of the RRAM device can reside within a height measured from a lower metal line 108 (e.g., metal 3 line) and an upper metal line 110 (e.g., a metal 4 line). In some embodiments, the overall thickness of the intercalated metal/dielectric structure 118 is less than 50 nm. Further, a ratio of $t_{metal}/t_{dielectric}$ can be tuned during manufacturing; where $t_{metal}$ is the total thickness of the sum of all the metal layers between the uppermost surface of the bottom electrode and the bottommost surface of the upper electrode, and where $t_{dielectric}$ is the total thickness of the sum of all the dielectric layers between the uppermost surface of the bottom electrode and the bottommost surface of the upper electrode. In some embodiments, $t_{metal}/t_{dielectric}$ can range from approximately 1:10 to approximately 2:1.

In some embodiments, the dielectric layers of the intercalated dielectric/metal structure have different thicknesses from one another; and the metal layers of the intercalated structure have different thicknesses from one another. Further, the thicknesses of the dielectric layers are often different from the thicknesses of the metal layers. In some embodiments, the metal layers have individual thicknesses ranging from 1 nm to 50 nm, and the dielectric layers have individual thicknesses ranging from 0.5 nm to 5 nm. In some cases, each dielectric layer has a thickness that is less than or equal to 10 nm (or even less than or equal to 5 nm), as thicknesses greater than 10 nm may thwart or impair filament formation. In some cases, the metal layers can be made of copper alloys and have individual thicknesses that vary between 15 nm to 30 nm, which provides for good tradeoffs between manufacturing costs and quality. If higher quality and/or thinner metal layers are desired, atomic layer deposition (ALD) or other deposition techniques could be used.

Although there is no limit to the number of metal layers and dielectric layers disposed between the bottom electrode and the upper electrode, in some cases it is advantageous to keep a maximum number of metal/dielectric periods to less than or equal to five (e.g., meaning five dielectric layers and five metal layers are arranged in alternating fashion between the bottom electrode and the upper electrode), because that maintains the speed of filament formation to levels similar to conventional approaches using a single (e.g., "thick") dielectric layer.

In some embodiments, the upper dielectric layer 122 and lower dielectric layer 120 comprise a high-κ dielectric layer, such as a hafnium-based oxide (e.g., $HfO_2$), a zirconium-based oxide (e.g., $ZrO_2$), and/or a titanium-based oxide (e.g., $TiO_2$). The high-κ dielectric layer has a dielectric constant, κ, of greater than that of silicon dioxide; and thus a high-κ dielectric layer has a dielectric constant of greater than 3.9. In some embodiments, the first metal layer (e.g., 124), the second metal layer (e.g., 130, 132, 134), and the third metal layer (e.g., 136) comprise a conductive metal, such as copper, aluminum, tungsten, and/or alloys of these metals including ternary chalcogenides. The upper electrode 116 and the bottom electrode 114 comprise a metal, such as tantalum, tantalum nitride, titanium, or titanium nitride, for example.

FIG. 5A illustrates a perspective view of some additional embodiments of an integrated chip including an array 500 of memory cells 502 arranged in rows and columns in a cross-bar configuration. The memory cells 502 are arranged in columns and rows, and for convenience, only some of the memory cells have been labeled 502. Each memory cell 502 can be generally cylindrical-, conical-, frustrum-conical-, pyramidal-, frustrum-pyramidal-, pillar-, cube-, or prism-shaped, and can extend between a wordline (WL) and corresponding bitline (BL). The bit lines (BL) extend laterally along corresponding columns of the array and electrically couple with memory cells in the corresponding columns, whereas word lines (WL) extend laterally along corresponding rows of the array and electrically couple with memory cells in the corresponding rows. For clarity, the bit lines are respectively labeled BL1, BL2, . . . , and BLN, where the subscripts identify corresponding columns and N is an integer variable representing a column in the memory array. Similarly, for clarity, the word lines are respectively labeled WL1, WL2, and WLM, where the subscripts identify corresponding rows and M is an integer variable representing a row in the memory array.

By appropriately biasing a bit line and a word line, the memory cell at the cross point of the bit line and the word line may be selected and read from or written to. In some embodiments, the bias conditions have different polarities depending upon whether writing a first data state to a memory cell or a second data state to a memory cell. Further, the selectors of an unselected row have a sufficiently high resistance to prevent read and/or write disturbance to unselected memory cells sharing a bit line or a source line with the selected memory cell.

FIGS. 5B-5D show various embodiments of memory cells 502 that include one or more RRAM devices which can be included in FIG. 5A's architecture. As can be seen from FIG. 5B, for example, each memory cell 502 can include a bottom electrode 114, a selector element 505 over the bottom electrode, an upper electrode 116 over the selector element 505, a memory element 504 over the upper electrode 116, and a top electrode 506 over the memory element 504. The memory element 504 stores at least one bit of information, while the selector element 505 has a resistance that controls whether the memory element coupled to the selector element is written to and/or read to. The selector element 505 can include the intercalated metal/dielectric structure 118 previously described in FIGS. 1-4, for example. Alternatively, as illustrated in FIG. 5C, the selector element 505 can again include the intercalated metal/dielectric structure 118 and be formed over the memory element 504. In some embodiments, the memory element 504 can also be implemented by using the intercalated metal/dielectric structure 118. Thus, FIG. 5D shows an example where the memory element 504 and the selector element 505 each include an intercalated metal/dielectric structure 118. Thus, in some embodiments, an RRAM device of FIGS. 1A-1B through 4A-4B can be used as the selector element, which exhibits a reduced threshold voltage compared to other approaches. In other embodiments, an RRAM device of FIGS. 1A-1B through 4A-4B can be used as the memory element to store one or more bits of data. The resistance of the memory element can be read to determine whether the memory cell is in the high-resistance state corresponding to a first logical value (e.g., a logical "0", such as in FIG. 1A) or whether the memory cell is in the low-resistance state corresponding to a second logical value (e.g., a logical "1", such as in FIG. 1B).

Figure 6:
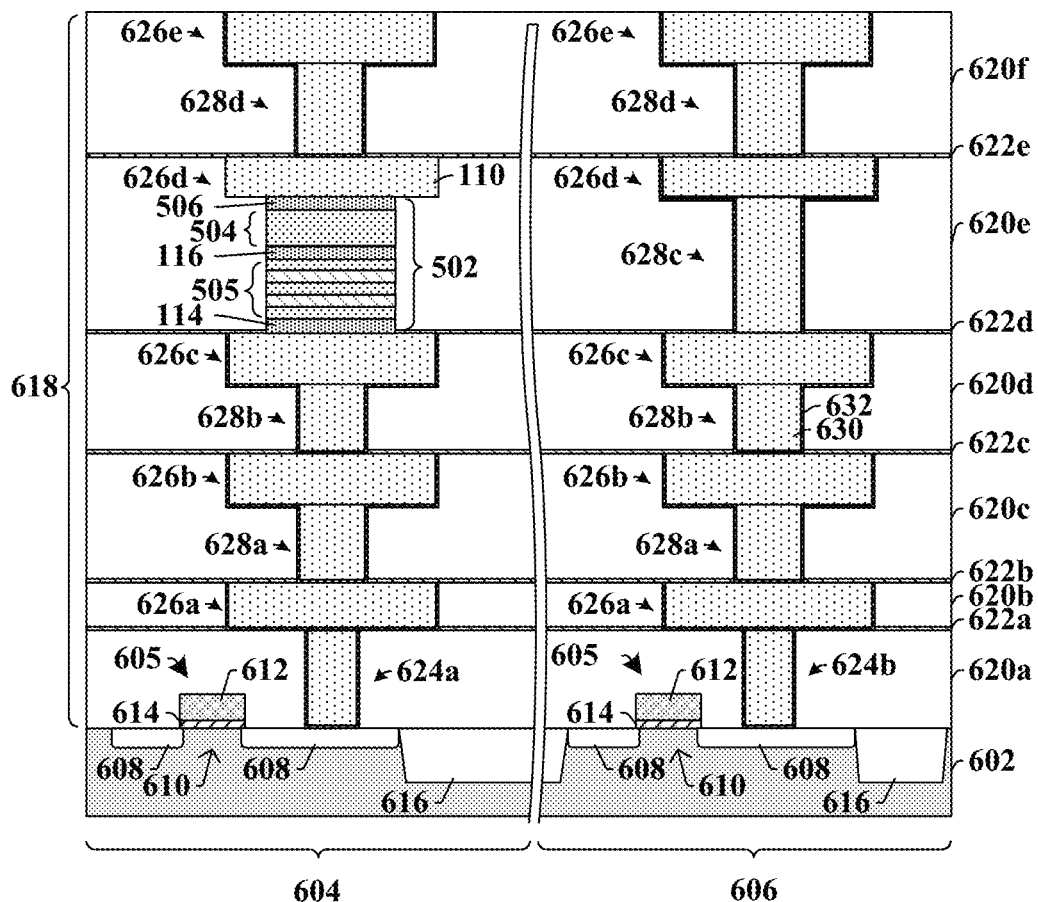
FIG. 6 illustrates a cross-sectional view of some additional embodiments of an integrated circuit, which comprises a resistive random access memory (RRAM) device with an intercalated metal/dielectric structure as a selector and/or memory element.

FIG. 6 illustrates a cross-sectional view of some additional embodiments of an integrated chip 600 that includes a semiconductor substrate 602. The integrated chip comprises a memory region 604, such as memory array 500, and a logic region 606 arranged around an outer periphery of the memory region.

Transistors 605 and/or other active devices are arranged in or over the substrate. Each transistor includes a source/drain regions 608 that are separated by a channel region 610. A gate electrode 612 overlies each channel region, and is separated from the channel region 610 by a gate dielectric 614. Isolation structures 616 (e.g., shallow trench isolation structures) may be arranged in the semiconductor substrate 602 to provide isolation between neighboring transistor devices.

A back-end-of-line (BEOL) interconnect structure 618 is disposed over the semiconductor substrate 602, and operably couples the transistors to one another. The BEOL interconnect structure 618 includes a dielectric structure with a plurality of conductive features disposed within the dielectric structure. The dielectric structure may comprise a plurality of stacked inter-level dielectric (ILD) layers 620a-620f. In various embodiments, the plurality of ILD layers 620a-620f may comprise one or more dielectric materials, such as a low-k dielectric material or an ultra-low-k (ULK) dielectric material, for example. In some embodiments, the one or more dielectric materials may comprise $SiO_2$, SiCO, a fluorosilicate glass, a phosphate glass (e.g., borophosphate silicate glass), etc. In some embodiments, etch stop layers (ESLs) 622a-622e may be disposed between adjacent ones of the ILD layers 620a-620f. For example, a first ESL 622a is disposed between a first ILD layer 620a and a second ILD layer 620b, a second ESL 622b is disposed between the second ILD layer 620b and a third ILD layer 620c, etc. In various embodiments, the ESLs 622a-622e may comprise a nitride, silicon carbide, carbon-doped oxide, or other similar materials.

A first conductive contact 624a and a second conductive contact 624b are arranged within the first ILD layer 620a. The first conductive contact 624a is electrically connected to a source/drain region of a transistor device in the memory region 604, and the second conductive contact 624b is electrically connected to source/drain region of a transistor device in the logic region 606. In various embodiments, the first conductive contact 624a and the second conductive contact 624b may be connected to a source region, a drain region, or a gate electrode of a transistor in the memory region or logic region. In some embodiments, the first conductive contact 624a and the second conductive contact 624b may comprise tungsten, for example.

Alternating layers of metal interconnect wires 626a-626e and metal vias 628a-628d are disposed over the first conductive contact 624a and the second conductive contact 624b. The metal interconnect wires 626a-626e and metal vias 628a-628d comprise a conductive material. In some embodiments, the metal interconnect wires 626a-626e and metal vias 628a-628d comprise a conductive core 630 and a liner layer 632 that separates the conductive core from surrounding ILD layers. In some embodiments, the liner layer may comprise titanium (Ti), titanium nitride (TiN), tantalum (Ta), or tantalum nitride (TaN). In some embodiments, the conductive core may comprise copper and/or aluminum, for example.

A memory cell 502, such as an RRAM device discussed in FIGS. 1-5, is arranged between metal interconnect wire 626c and an upper metal interconnect wire 626e in the memory region 604. Thus, in some embodiments, the memory cell 502 in the memory region 604 has an overall height that is sufficient to fit between nearest neighboring metal lines in the logic region 606.

FIGS. 7-13 illustrate some embodiments of cross-sectional views 700-1300 showing a method of forming an IC comprising an RRAM device. Although the cross-sectional-views shown in FIGS. 7-13 are described with reference to a method of forming an RRAM device, it will be appreciated that the structures shown in the figures are not limited to the method of formation but rather may stand alone separate of the method.

Figure 7:
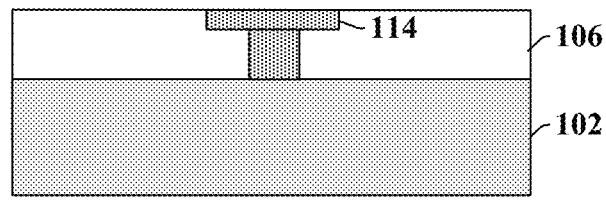
FIGS. 7-13 illustrate some embodiments of cross-sectional views showing a method of forming an IC comprising an RRAM device having an upper electrode contacting an overlying interconnect wire.

As illustrated in cross-sectional view 700 of FIG. 7, a bottom electrode 114 is formed within a dielectric layer 106 over a semiconductor substrate 102. In various embodiments, the semiconductor substrate 102 may comprise a semiconductor body (e.g., monocrystalline silicon, SiGe, silicon-on-insulator (SOI)) such as a semiconductor wafer and/or one or more die on a wafer, as well as any other type of metal layer, device, semiconductor and/or epitaxial layers, etc., associated therewith. The dielectric layer 106 is selectively etched to define a plurality of cavities within the dielectric layer 106. The plurality of cavities are filled with a first conductive material to establish the bottom electrode 114. In various embodiments, the first conductive material may comprise copper, tungsten, and/or aluminum, for example. In some embodiments, the first conductive material may be deposited by way of a plating process (e.g., an electro plating process, an electro-less plating process). In other embodiments, the first conductive material may be deposited using a vapor deposition technique (e.g., CVD, PVD, ALD, PE-ALD, etc.). In some embodiments, one or more liner layers (not shown) may be deposited within the plurality of cavities prior to filling the plurality of cavities with the first conductive material.

Figure 8:
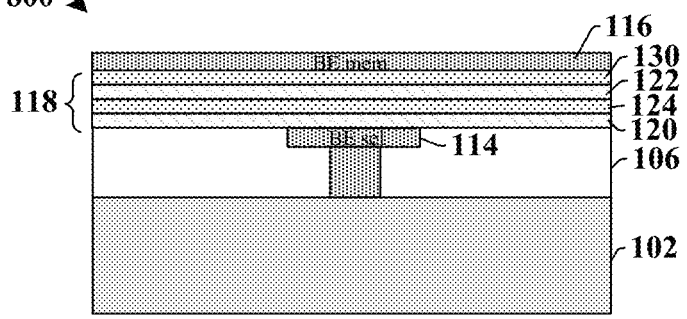

As illustrated in cross-sectional view 800 of FIG. 8, an intercalated metal/dielectric structure 118 is formed over the dielectric layer 106. In some embodiments, intercalated metal/dielectric structure 118 may be formed by forming a lower dielectric layer 120 over the bottom electrode, a first metal layer 124 over the lower dielectric layer 120, an upper dielectric layer 122 over the first metal layer 124, and a second metal layer 130 over the upper dielectric layer 122. An upper electrode layer 116 can then be formed over the second metal layer 130. Other configurations can also be formed, for example, to establish the structures previously described in FIGS. 1-5, for example.

In various embodiments, the bottom electrode 114, the lower dielectric layer 120, upper dielectric layer 122, and the upper electrode 116 may be deposited using vapor deposition techniques (e.g., CVD, PVD, ALD, PE-ALD, etc.). In various embodiments the first and/or second metal layer are made of a metal, and are formed by sputtering, electroplating, electroless plating, or a vapor deposition technique, for example. In various embodiments, the bottom electrode 114 and the upper electrode 116 may comprise a metal nitride or a metal. For example, in some embodiments, the bottom electrode 114 and/or the upper electrode 116 may comprise a conductive material such as platinum (Pt), aluminum-copper (AlCu), titanium nitride (TiN), gold (Au), titanium (Ti), tantalum (Ta), tantalum nitride (TaN), tungsten (W), tungsten nitride (WN), and/or copper (Cu), for example. In various embodiments, the lower dielectric layer 120 and upper dielectric layer 122 may comprise nickel oxide (NiO), titanium oxide (TiO), hafnium oxide (HfO), zirconium oxide (ZrO), zinc oxide (ZnO), tungsten oxide (WO$_3$), aluminum oxide (Al$_2$O$_3$), tantalum oxide (TaO), molybdenum oxide (MoO), and/or copper oxide (CuO), for example. In various embodiments, the first metal layer 124 and/or second metal layer 130 comprise a conductive metal, such as copper, aluminum, tungsten, and/or alloys of these metals including ternary chalcogenides.

Figure 9:
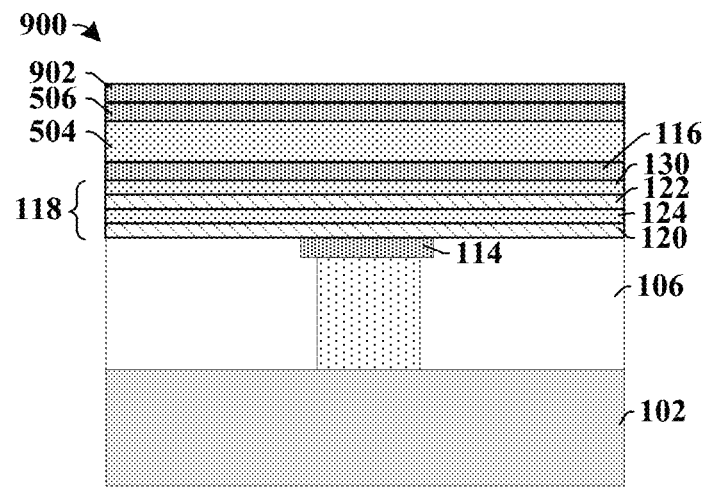

As illustrated in cross-sectional view 900 of FIG. 9, a memory element 504 and a top electrode layer 506 are formed over the intercalated metal/dielectric structure 118 (of FIG. 8). In some embodiments, the memory element 504 is a non-volatile memory (NVM) device, such as an RRAM device including one or more chalcogenide-based dielectric layers sandwiched between a pair of electrodes, but in other embodiments the memory element can take other forms, such as a phase-change memory element, or a metal-insulator-metal capacitor, for example. In some embodiments, the top electrode layer 506 and/or the upper electrode layer 116 may comprise a conductive material such as platinum (Pt), aluminum-copper (AlCu), titanium nitride (TiN), gold (Au), titanium (Ti), tantalum (Ta), tantalum nitride (TaN), tungsten (W), tungsten nitride (WN), and/or copper (Cu), for example. A hardmask 902, such as a nitride hardmask or oxynitride hardmask, can be formed over the top electrode 506.

Figure 10:
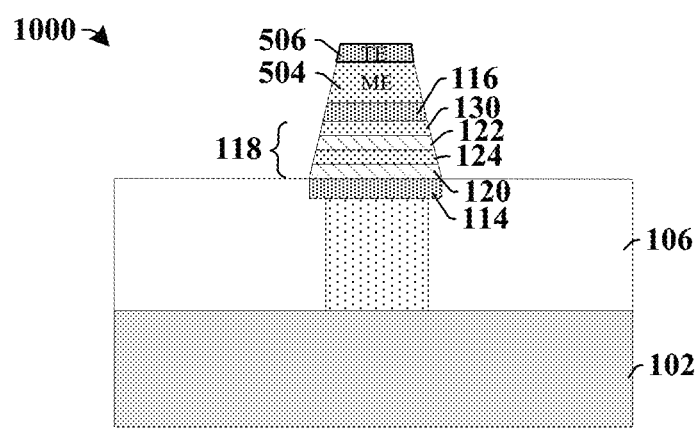

As illustrated in cross-sectional view 1000 of FIG. 10, the intercalated metal/dielectric structure 118 (of FIG. 7) is patterned to define a patterned device structure. The patterned device structure comprises a bottom electrode 114, a RRAM device 112 arranged over the bottom electrode 114, and a top electrode 506 arranged over the RRAM device 112. The RRAM device 112 can be generally cylindrical-, conical-, frustrum-conical-, pyramidal-, frustrum-pyramidal-, pillar-, cube-, or prism-shaped, and can extend between a wordline (WL) and corresponding bitline (BL).

Figure 11:
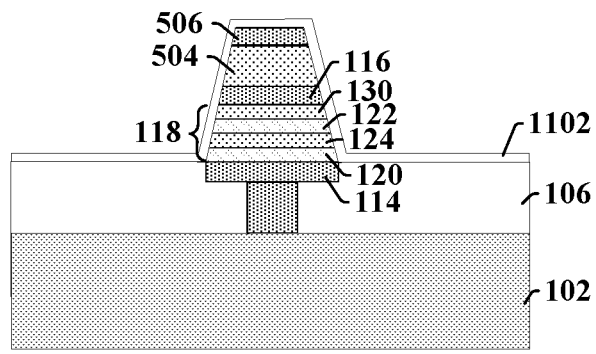

As illustrated in cross-sectional view 1100 of FIG. 11, a dielectric liner 1102 may be formed over the on opposing sides of the patterned device structure. In some embodiments, sidewall spacers may be formed by etching back the dielectric liner 1102, such that the dielectric liner is removed from horizontal surfaces, leaving the sidewall spacers along opposing sides of the patterned device structure. In various embodiments, the dielectric liner 1102 may comprise silicon nitride, a silicon dioxide (SiO$_2$), silicon oxy-nitride (e.g., SiON), or a similar material.

Figure 12:
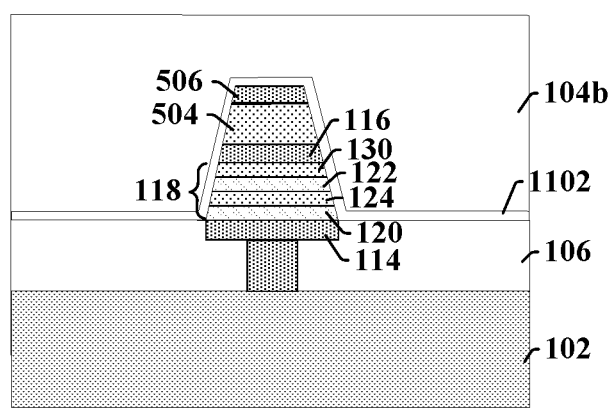

As illustrated in cross-sectional view 1200 of FIG. 12, a second ILD layer 104b is formed over the patterned device structure. The second ILD layer 104b may be formed by a vapor deposition technique (e.g., CVD, PVD, ALD, PE-ALD, etc.), spin on technique, or other technique.

Figure 13:
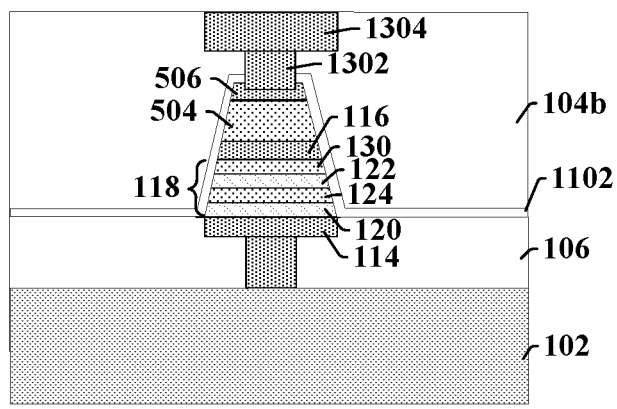

As illustrated in cross-sectional view 1300 of FIG. 13, the second ILD layer 104b is selectively etched to define a second plurality of cavities within the second ILD layer 104b. In some embodiments, the second ILD layer 104b may be patterned by selectively exposing the second ILD layer 104b to an etchant in areas not covered by a masking layer. The cavities are then filled with metal to establish a via 1302 coupled to the top electrode 506, and an upper metal line 1304 over the via.

Figure 14:
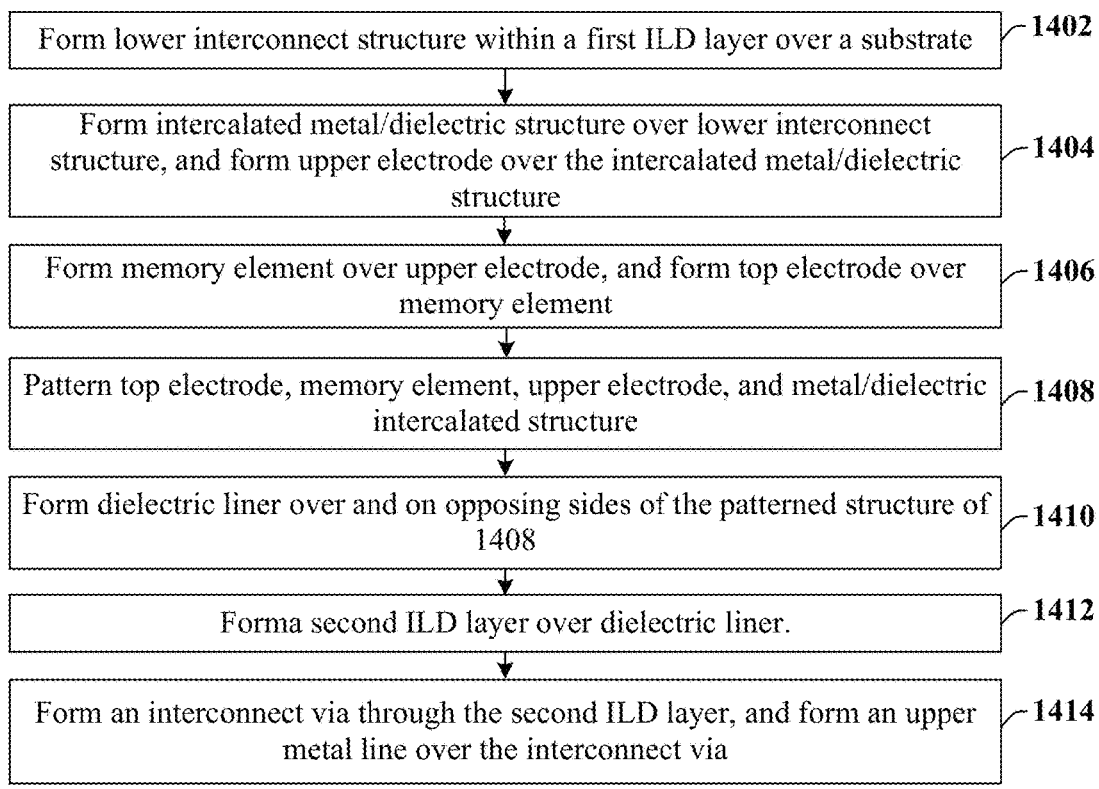
FIG. 14 illustrates some embodiments of a method in flowchart format for forming an RRAM device with an intercalated metal/dielectric structure.

FIG. 14 illustrates a flow diagram of some embodiments of a method 1400 of forming an IC comprising an RRAM device having an upper electrode contacting an interconnect wire.

While disclosed methods (e.g., method 1400) may be illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1402, a lower interconnect structure is formed within a first inter-level dielectric (ILD) layer over a substrate. In various embodiments, the lower interconnect structure may comprise a bottom electrode, an interconnect contact, an interconnect via, or an interconnect wire. FIG. 7 illustrates some embodiments of a cross-sectional view 700 corresponding to act 1402.

At 1404, an intercalated metal/dielectric structure 118 is formed over the lower interconnect structure. The intercalated metal/dielectric structure comprises a lower dielectric layer, an upper dielectric layer over the lower dielectric layer, and a first metal layer separating the upper dielectric layer from the lower dielectric layer. An upper electrode can be formed over the intercalated metal/dielectric structure. FIG. 8 illustrates some embodiments of cross-sectional views 800 corresponding to act 1404.

At 1406, a memory element is formed over the upper electrode, and a top electrode is formed over the memory element. FIG. 9 illustrates some embodiments of a cross-sectional view 900 corresponding to act 1406.

At 1408, top electrode, memory element, upper electrode, and intercalated metal/dielectric structure are patterned. FIG. 10 illustrates some embodiments of a cross-sectional view 1000 corresponding to act 1408.

At 1410, a dielectric liner may be formed over and on opposing sides of the patterned structure of 1408. FIG. 11 illustrates some embodiments of a cross-sectional view 1100 corresponding to act 1410.

At 1412, a second ILD layer is formed over dielectric liner. FIG. 12 illustrates some embodiments of a cross-sectional view 1200 corresponding to act 1412.

At 1414, an interconnect via is formed through the second ILD layer, and an upper metal line is formed over the interconnect via. FIG. 13 illustrates some embodiments of a cross-sectional view 1300 corresponding to act 1414.

Thus, some embodiments relate to an integrated chip including a memory device. The memory device includes a bottom electrode disposed over a semiconductor substrate. An upper electrode is disposed over the bottom electrode. An intercalated metal/dielectric structure is sandwiched between the bottom electrode and the upper electrode. The intercalated metal/dielectric structure comprises a lower dielectric layer over the bottom electrode, an upper dielectric layer over the lower dielectric layer, and a first metal layer separating the upper dielectric layer from the lower dielectric layer.

Other embodiments relate to an integrated chip, comprising: a lower conductive interconnect structure surrounded by a first inter-level dielectric (ILD) layer and arranged over a substrate; a bottom electrode disposed over the lower interconnect structure; a top electrode disposed over the bottom electrode, the top electrode residing below the upper interconnect structure; and a plurality of metal layers and a plurality of dielectric layers stacked in alternating fashion over one another and sandwiched between the top and bottom electrode. Still other embodiments relate to a method. In the method, a lower interconnect structure is formed within a first inter-level dielectric (ILD) layer over a substrate. An intercalated metal/dielectric structure is formed over the lower interconnect structure. The intercalated metal/dielectric structure comprises a lower dielectric layer over the lower interconnect structure, an upper dielectric layer over the lower dielectric layer, and a first metal layer separating the upper dielectric layer from the lower dielectric layer. An upper electrode is formed over the intercalated metal/dielectric structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip including a memory device, the memory device comprising:
   a bottom electrode disposed over a semiconductor substrate;
   an upper electrode disposed over the bottom electrode; and
   an intercalated metal/dielectric structure sandwiched between the bottom electrode and the upper electrode, the intercalated metal/dielectric structure comprising a lower dielectric layer over the bottom electrode, an upper dielectric layer over the lower dielectric layer, and a first metal layer separating the upper dielectric layer from the lower dielectric layer;
   wherein the upper dielectric layer has a first width, the first metal layer has a second width greater than the first width, and the lower dielectric layer has a third width that is greater than the second width, such that the intercalated metal/dielectric structure has outermost sidewalls that are slanted continuously from the upper dielectric layer to the lower dielectric layer.

2. The integrated chip of claim 1, wherein when the memory device is in a first state, a lower conductive filament extends from the bottom electrode through the lower dielectric layer and to the first metal layer, and an upper conductive filament extends from the first metal layer through the upper dielectric layer and to the upper electrode.

3. The integrated chip of claim 2, wherein when the memory device is in a second state, at least a portion of the lower conductive filament is removed or broken so the lower dielectric layer separates the bottom electrode from the first metal layer, and/or at least a portion of the upper conductive filament is removed or broken so the upper dielectric layer separates the first metal layer from the upper electrode.

4. The integrated chip of claim 1, wherein the intercalated metal/dielectric structure further comprises:
   a second metal layer disposed over the upper dielectric layer, the second metal layer separating the upper dielectric layer from the upper electrode.

5. The integrated chip of claim 1, wherein the intercalated metal/dielectric structure further comprises:
a second metal layer disposed over the bottom electrode, the second metal layer separating the bottom electrode from the lower dielectric layer.

6. The integrated chip of claim 5, wherein the intercalated metal/dielectric structure further comprises:
a third metal layer disposed over the upper dielectric layer, the third metal layer separating the upper dielectric layer from the upper electrode.

7. The integrated chip of claim 6, wherein the upper dielectric layer and lower dielectric layer comprise a high-k dielectric material; the first metal layer, the second metal layer, and the third metal layer comprise copper, aluminum, or tungsten; and the upper electrode and the bottom electrode comprise tantalum or titanium.

8. The integrated chip of claim 1, further comprising a resistive random access memory (RRAM) cell disposed over the upper electrode, the RRAM cell comprising:
a data storage dielectric layer disposed over the upper electrode; and
a top electrode disposed over the data storage dielectric layer.

9. The integrated chip of claim 1, further comprising:
a dielectric liner along sidewalls of the intercalated metal/dielectric structure.

10. The integrated chip of claim 1, further comprising:
a low-k dielectric layer over the intercalated metal/dielectric structure; and
a dielectric liner along outermost sidewalls of the upper electrode and along the outermost sidewalls of the intercalated metal/dielectric structure, wherein the dielectric liner slants continuously from a top surface of the upper electrode to a top surface of the bottom electrode and laterally separates the low-k dielectric layer from the intercalated metal/dielectric structure.

11. An integrated chip, comprising:
an interconnect structure including a lower metal layer and an upper metal layer which are separated from one another by a first inter-level dielectric (ILD) layer;
a bottom electrode disposed over the lower metal layer;
a top electrode disposed over the bottom electrode, the top electrode residing below the upper metal layer; and
a plurality of metal layers and a plurality of dielectric layers stacked in alternating fashion over one another and sandwiched between the top electrode and the bottom electrode,
wherein a bottommost surface of the plurality of metal layers and the plurality of dielectric layers has a larger area than a topmost surface of the plurality of metal layers and the plurality of dielectric layers, and wherein a bottom surface of the top electrode has a larger area than a top surface of the top electrode.

12. The integrated chip of claim 11, wherein at least two of the plurality of metal layers have different thicknesses from one another.

13. The integrated chip of claim 11, wherein at least two of the plurality of dielectric layers have different thicknesses from one another.

14. The integrated chip of claim 11, wherein a maximum thickness of any of the plurality of dielectric layers is less than 10 nm.

15. The integrated chip of claim 11, wherein the plurality of dielectric layers include a plurality of conductive filaments, respectively, wherein each conductive filament extends through a corresponding dielectric layer to couple neighboring metal layers in the plurality of metal layers to one another.

16. A method, comprising:
forming a lower interconnect structure within a first inter-level dielectric (ILD) layer over a substrate;
forming an intercalated metal/dielectric structure over the lower interconnect structure, the intercalated metal/dielectric structure comprising a lower dielectric layer over the lower interconnect structure, an upper dielectric layer over the lower dielectric layer, and a first metal layer separating the upper dielectric layer from the lower dielectric layer;
forming an upper electrode over the intercalated metal/dielectric structure,
forming a memory element over the upper electrode;
forming a top electrode over the memory element; and
patterning the top electrode, the memory element, the upper electrode, and the intercalated metal/dielectric structure, thereby forming a patterned device structure, wherein opposing outer sidewalls of the patterned device structure are slanted downwards away from a center of the patterned device structure.

17. The method of claim 16, further comprising:
forming a second ILD layer over the patterned device structure; and
forming a via and top metal line within the second ILD layer, wherein the via couples the top metal line to an upper portion of the upper electrode.

18. The method of claim 16, wherein the intercalated metal/dielectric structure includes five or fewer dielectric layers between the lower interconnect structure and the upper electrode.

19. The method of claim 16, further comprising: applying a first bias between the lower interconnect structure and the upper electrode to induce a first state in the intercalated metal/dielectric structure; wherein in the first state, a lower conductive filament extends from the lower interconnect structure through the lower dielectric layer and to the first metal layer, and an upper conductive filament extends from the first metal layer through the upper dielectric layer and to the upper electrode.

20. The method of claim 19, further comprising: applying a second bias between the lower interconnect structure and the upper electrode to induce a second state in the intercalated metal/dielectric structure; wherein in the second state, at least a portion of the lower conductive filament is removed or broken so the lower dielectric layer separates the lower interconnect structure from the first metal layer, and/or at least a portion of the upper conductive filament is removed or broken so the upper dielectric layer separates the first metal layer from the upper electrode.

* * * * *